(12) United States Patent
Kang et al.

(10) Patent No.: US 6,215,723 B1
(45) Date of Patent: Apr. 10, 2001

(54) SEMICONDUCTOR MEMORY DEVICE HAVING SEQUENTIALLY DISABLING ACTIVATED WORD LINES

(75) Inventors: Sang-seok Kang, Suwon; Jae-hoon Joo, Yongin, both of (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/489,236

(22) Filed: Jan. 21, 2000

(30) Foreign Application Priority Data

Apr. 7, 1999 (KR) .................................................. 99-12026

(51) Int. Cl.[7] ...................................................... G11C 8/00
(52) U.S. Cl. ...................................... 365/230.06; 365/203
(58) Field of Search ......................... 365/230.06, 230.03, 365/203, 206, 189.09, 194, 230.09

(56) References Cited

U.S. PATENT DOCUMENTS 6,009,037   12/1999   Bosshart ........................ 365/230.06
6,064,622 * 5/2000   Lee et al. ........................ 365/230.06

* cited by examiner

Primary Examiner—David Nelms
Assistant Examiner—David Lam
(74) Attorney, Agent, or Firm—F. Chau & Associates, LLP (57) ABSTRACT

A semiconductor memory device for sequentially disabling activated word lines is provided. The semiconductor memory device having a plurality of word lines connected to a plurality of memory cells includes a predecoding unit for predecoding a row address received from the outside, a row decoding and word line driving block, which is connected to the predecoding unit and the plurality of word lines, for decoding an output of the predecoding unit, selecting some of the plurality of word lines, and activating the selected word lines and a controller connected to the predecoding unit and the row decoding and word line driving block, for receiving the row address, the output of the predecoding unit, and at least one control signal, generating at least one output signal, and sequentially disabling the activated word lines by enabling the at least one output signal in response to the row address and the output of the predecoding unit.

20 Claims, 8 Drawing Sheets

SEMICONDUCTOR MEMORY DEVICE HAVING SEQUENTIALLY DISABLING ACTIVATED WORD LINES

BACKGROUND OF THE INVENTION

1. Field of the Invention

The present invention relates to a semiconductor memory device, and more particularly, to a semiconductor memory device having sequentially disabling activated word lines.

2. Description of the Related Art

When a semiconductor memory device is manufactured, the semiconductor memory device undergoes a burn-in stress test and a function test. The burn-in stress test ensures that the semiconductor memory device works under prescribed stress conditions, such as a boosted voltage applied to the semiconductor memory device. The function test is for testing whether the semiconductor memory device operates normally according to a predetermined product specification.

Generally, a method of simultaneously activating a plurality of word lines or sequentially activating a plurality of word lines is used to reduce the time required for the burn-in stress test or the function test. Then, the plurality of activated word lines are simultaneously disabled after the activation of the plurality of word lines. When the plurality of activated word lines are simultaneously disabled, precharge noise is generated during a process where the plurality of word lines are transited from a high level to a low level. The precharge noise can have a critical influence on operations of the semiconductor memory device.

Therefore, a need exists for a semiconductor memory device having function of sequentially disabling the activated word lines to prevent the precharge noise from occurring at the time of disabling the activated word lines.

SUMMARY OF THE INVENTION

It is an object of the present invention to provide a semiconductor memory device for preventing precharge noise from being generated in a process of disabling a plurality of activated word lines.

Accordingly, the present invention provides a semiconductor memory device having a plurality of memory cells and a plurality of word lines connected to the plurality of memory cells, comprising a predecoding unit, a row decoding and word line driving block, and a controller. The predecoding unit predecodes a row address received from the outside. The row decoding and word line driving block, which is connected to the predecoding unit and the plurality of word lines, decodes an output of the predecoding unit, selects some of the plurality of word lines, and activates selected word lines. The controller connected to the predecoding unit and the row decoding and word line driving block, receives the row address, the output of the predecoding unit, and at least one control signal, generates at least one output signal, and sequentially disables the activated word lines by enabling the at least one output signal in response to the row address and the output of the predecoding unit when the at least one control signal is enabled in a state where some of the plurality of word lines are activated. The at least one control signal may be a mode register set signal for controlling operating modes of the semiconductor memory device, and may have a voltage higher than a supply voltage of the semiconductor memory device.

The controller may include a first row decoding controller for generating first and second word line control signals by receiving the row address, the mode register set signal, the precharge signal, and an active signal, wherein the first row decoding controller enables the first and second word line control signals when the mode register set signal and the active signal are enabled in a state where the precharge signal is disabled, and disables the first and second word line control signals when the precharge signal is enabled; a second row decoding controller connected to the first row decoding controller, the predecoding unit, and the row decoding and word line driving block, for providing the row decoding word line driving block with a word line enabled signal in response to the first word line control signal and the output of the predecoding unit; a third row decoding controller connected to the first row decoding controller, the predecoding unit, and the row decoding and word line driving block, for providing the row decoding and word line driving block with a block selection signal in response to the first word line control signal and the output of the predecoding unit; and a word line driving controller for receiving the second word line control signal and the output of the predecoding unit, and for providing the row decoding and word line driving block with a word line driving signal in response to the first word line control signal and the output of the predecoding unit.

The first row decoding controller may include a transmission gate for transmitting the row address in response to the mode register set signal, a logic circuit for performing a predetermined logic operation with respect to an output of the transmission gate and the active signal to generate the first word line control signal, a transistor connected between the transmission gate and the logic circuit and gated by the precharge signal, for transferring an output of the transmission gate to the logic circuit in response to the precharge signal, and a delay circuit for delaying the first word line control signal for a predetermined time to generate the second word line control signal.

The first row decoding controller, as another embodiment, may include a transistor chain having a plurality of transistors, for lowering a high voltage input by a level depending on the number of the plurality of transistors, a first logic circuit for performing a predetermined first logic operation with respect to an output of the transistor chain and the precharge signal, a transistor gated by a high voltage control signal, for controlling transmission of the output of the transistor chain to the first logic circuit in response to the high voltage control signal, a second logic circuit for performing a predetermined second logic operation with respect to an output of the first logic circuit and the active signal to generate the first word line control signal, and a delay circuit for delaying the first word line control signal for a predetermined time to generate the second word line control signal.

The third row decoding controller may include an inverter chain having a plurality of inverters, for inverting and delaying the first word line control signal, and a logic circuit for operating a predetermined logic operation on the first word line control signal, the output of the inverter chain, and the output of the predecoding unit to generate the block selection signal.

The word line driving controller may include a logic circuit for performing a predetermined logic operation with respect to the second word line control signal and the output of the predecoding unit, an inverter for inverting an output of the logic circuit, and a differential amplifier receiving a supply voltage, for amplifying a voltage difference between the output of the logic circuit and an output of the inverter to generate the word line driving signal.

The row decoding and word line driving block may include a plurality of row decoder and word line drivers, each row decoder and word line driver receiving the output of the predecoding unit, the word line enable signal, the block selection signal, the word line driving signal, and the second word line control signal, for selecting a portion of the plurality of word lines to activate or disable the selected word lines. The row decoder and word line driver includes a row decoder for receiving the output of the predecoding unit, the word line enable signal, the block selection signal, and the second word line control signal, for outputting a ground voltage when the output of the predecoding unit and the block selection are enabled, and for outputting a supply voltage when the word line enable signal is enabled and one of the output of the predecoding unit and the block selection signal is disabled; and a plurality of word line drivers, each word line driver connected to a word line for activating or disabling the word line in response to the word line driving signal and an output of the row decoder.

According to the semiconductor memory device of the present invention, the precharge noise is not generated when the plurality of activated word lines are disabled.

BRIEF DESCRIPTION OF THE DRAWINGS

The above and other objects and advantages of the present invention will become more apparent by describing in detail preferred embodiments thereof with reference to the attached drawings in which.

DESCRIPTION OF PREFERRED EMBODIMENTS

The attached drawings showing preferred embodiments of the present invention should be referred to fully understand the advantages and operations of the present invention and the objects achieved by the present invention. Hereinafter, the present invention will be described in detail by explaining preferred embodiments of the present invention with reference to the attached drawings. The same reference numerals in the drawings denote the same members.

Figure 1:
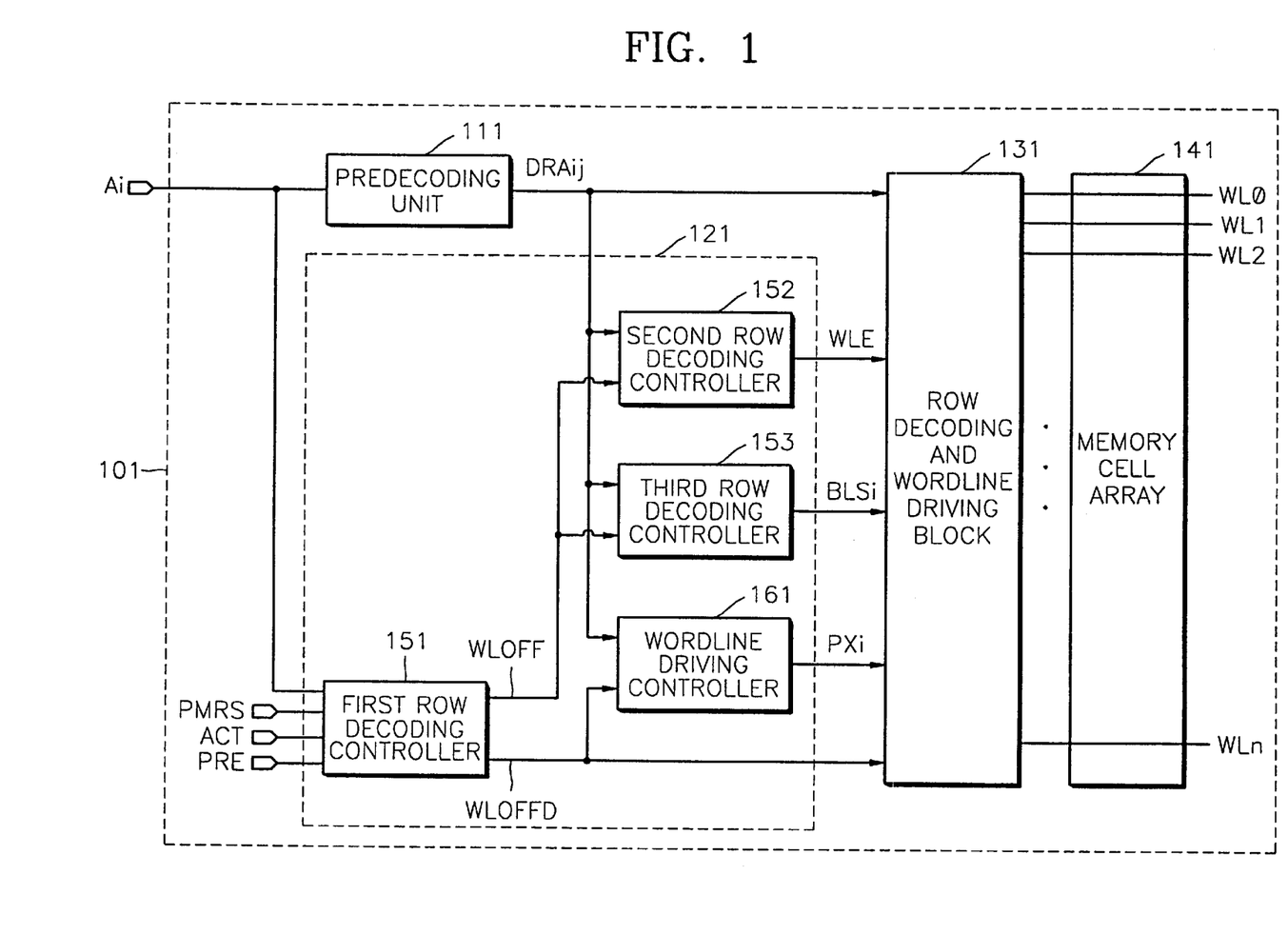
FIG. 1 is a schematic block diagram of a semiconductor memory device according to a preferred embodiment of the present invention.
Figure 2:
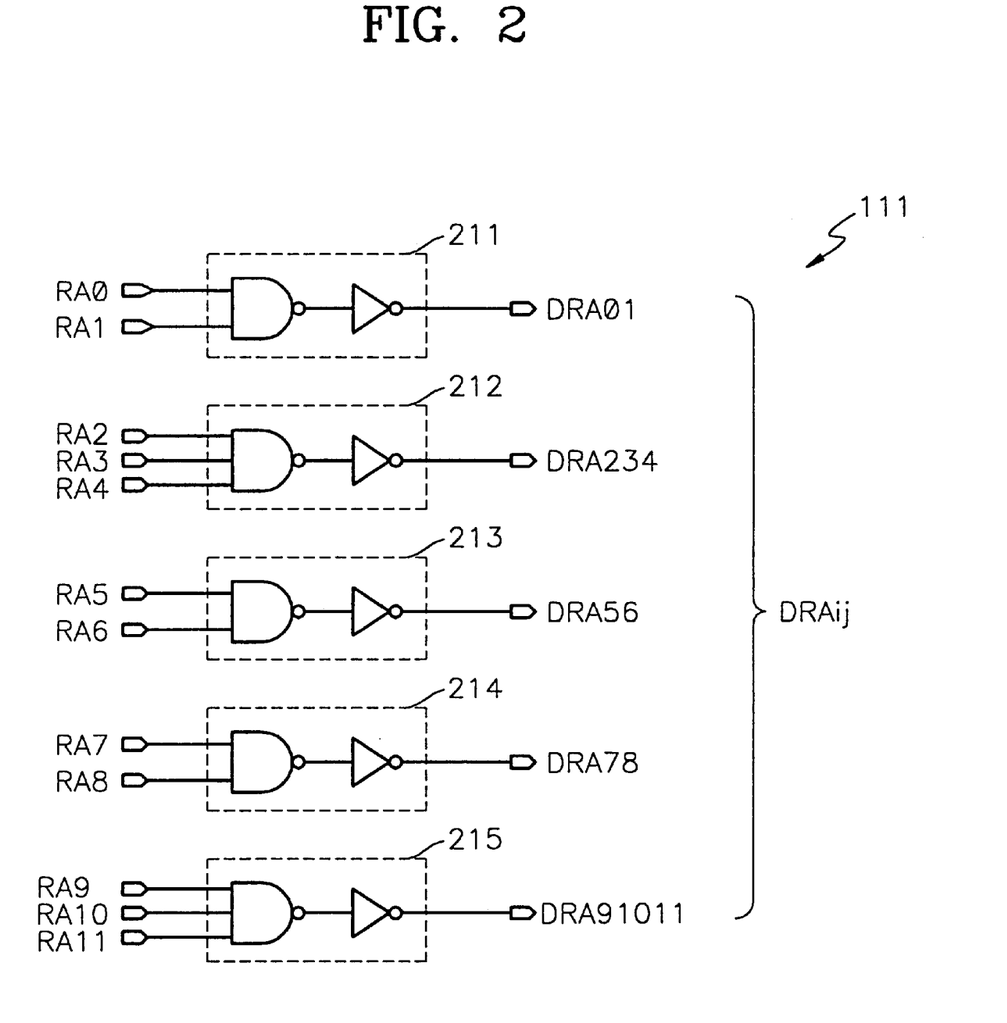
FIG. 2 is a circuit diagram of the predecoding unit shown in FIG. 1.

Referring to FIG. 1, a semiconductor memory device 101 according to a preferred embodiment of the present invention includes a predecoding unit 111, a controller 121, a row decoding and word line driving block 131, and a memory cell array 141. The controller 121 includes first through third row decoding controllers 151 through 153 and a word line driving controller 161. The predecoding unit 111 receives row address Ai, predecodes the row address Ai, and outputs a predecoding signal DRAij. FIG. 2 shows a preferred embodiment of the predecoding unit 111 in FIG. 1.

Referring to FIG. 2, the predecoding unit 111 includes first through fifth predecoders 211 through 215. The first through fifth predecoders 211 through 215 receive a plurality of row address bits RA0 through RA11 and generate first through fifth predecoding signals DRA01, DRA234, DRA56, DRA78, and DRA91011, respectively. The first through fifth predecoding signals DRA01, DRA234, DRA56, DRA78, and DRA91011 are represented as a predecoding signal DRAij. The number of first through fifth predecoders may vary according to characteristics of the semiconductor memory device 101. For example, the predecoding unit 111 may have four (4) predecoders for receiving four (4) groups of row address bits RA0 through RA11, respectively, each group having three (3) row address bits. The predecoding unit 111 may also have six (6) predecoders for receiving six (6) groups of row address bits RA0 through RA11, respectively, each group having two (2) row address bits. The number of predecoders may vary according to the number of row address bits of the row address Ai. For example, when the number of row address bits increases (i.e., memory capacity of the semiconductor memory device 101 increases), the number of predecoders increases. When the number of row address bits decreases (i.e., memory capacity of the semiconductor memory device 101 is reduced), the number of predecoders may decrease.

Referring to FIG. 1 again, the controller 121 includes first, second and third row decoding controllers 151–153. The first row decoding controller 151 receives the row address Ai, a mode register set signal PMRS or a high voltage (this will be described below referring to FIG. 4), an active signal ACT, and a precharge signal PRE, and generates first and second word line control signals WLOFF and WLOFFD. The second word line control signal WLOFFD is obtained by delaying the first word line control signal WLOFF for a predetermined time.

Figure 3:
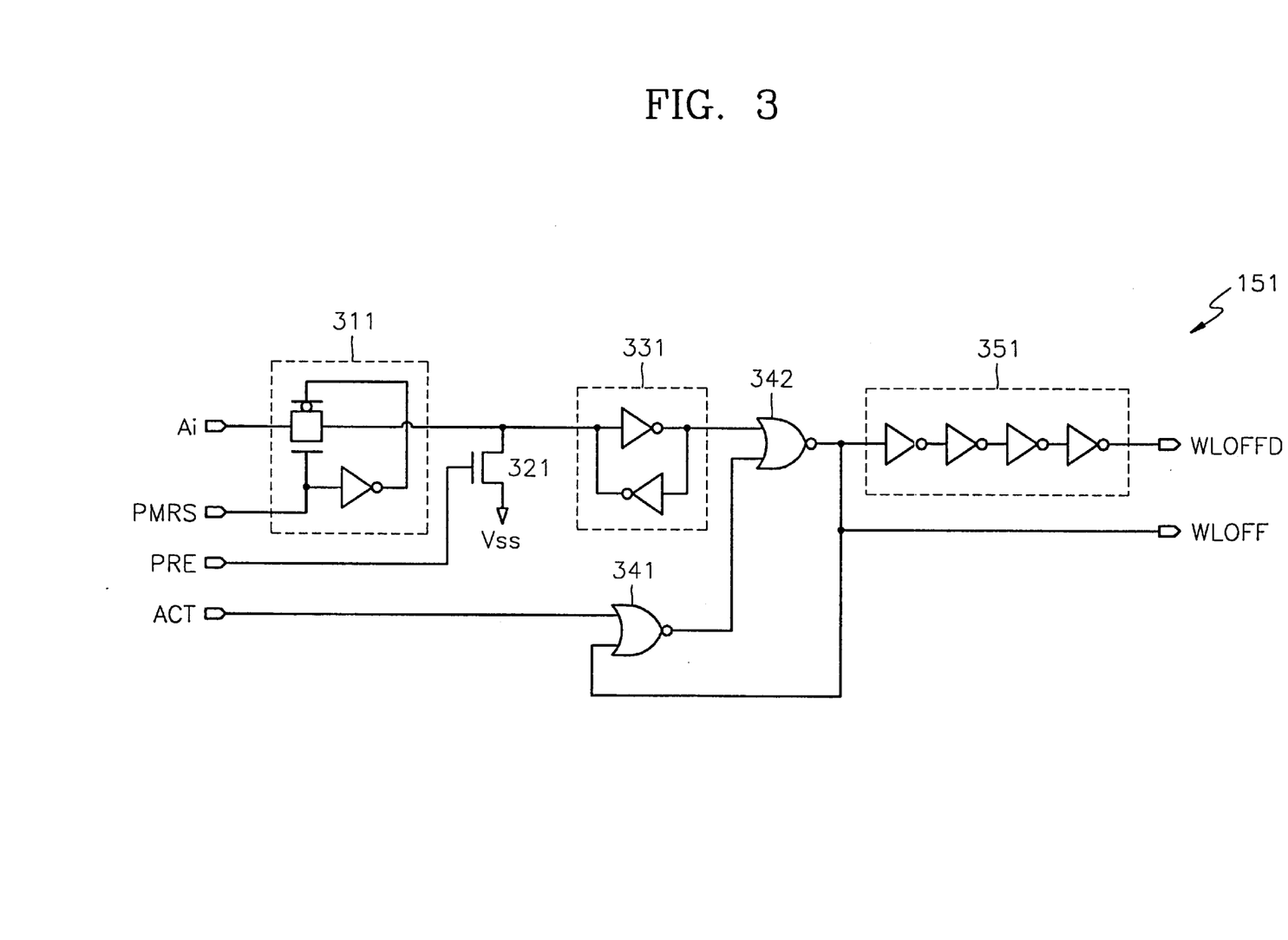
FIG. 3 is a circuit diagram of the first row decoding controller shown in FIG. 1 according to a first embodiment of the present invention.

Referring to FIG. 3, the first row decoding controller 151 according to a first embodiment of the present invention includes a transmission gate 311, an NMOS transistor 321, a latch 331, NOR gates 341 and 342, and a delay unit 351. The transmission gate 311 receives the row address Ai and outputs the received row address Ai in response to the mode register set signal PMRS. Namely, the transmission gate 311 transmits the row address Ai to the latch when the mode register set signal PMRS is enabled to logic high, and blocks the row address Ai when the mode register set signal PMRS is disabled to logic low. The mode register set signal PMRS is generated by a mode register which is generally included in a synchronous DRAM semiconductor device. The row address Ai input to the transmission gate 311 is not an address signal for designating memory cells in the memory cell array 141 but a row address key signal for the use of generating the first word line control signal WLOFF.

The NMOS transistor 321 is gated by the precharge signal PRE. Namely, when the precharge signal PRE is enabled to logic high, the NMOS transistor 321 is turned on. When the precharge signal PRE is disabled to logic low, the NMOS transistor 321 is turned off. When the NMOS transistor 321 is turned on, the voltage level of the output of the transmission gate 311 is pulled down to the ground voltage Vss level. When the NMOS transistor 321 is turned off, the output of the transmission gate 311 is transmitted to the latch 331. The precharge signal PRE is enabled when the semiconductor memory device 101 is in a stand-by state.

The latch 331 receives and inverts the output of the transmission gate 311 and continuously outputs the inverted output. The latch 331 continuously outputs the same signal unless the voltage level of the output of the transmission gate 311 is changed. Namely, if the output of the transmission gate 311 is logic low even for a moment, the output of the latch 331 becomes and maintains logic high. The latch 331 continuously outputs a logic high signal even if the output of the transmission gate 311 is stopped. The latch 331 continuously outputs a signal of logic high unless the output of the transmission gate 311 is changed to logic high.

The NOR gate 341 performs a NOR operation on an active signal ACT and an output of the NOR gate 342, and outputs a result of the NOR operation. The NOR gate 342 performs a NOR operation on the output of the latch 331 and the output of the NOR gate 341, and outputs the first word line control signal WLOFF. The NOR gates 341 and 342 can be configured using various circuits. The delay unit 351 receives the first word line control signal WLOFF, delays the first word line control signal for a predetermined period of time, and outputs the second word line control signal WLOFFD. The delay unit 351 has an even number of inverters. The predetermined delay time varies according to the number of the inverters. Namely, when the number of the inverters increases, the predetermined delay time increases.

Figure 4:
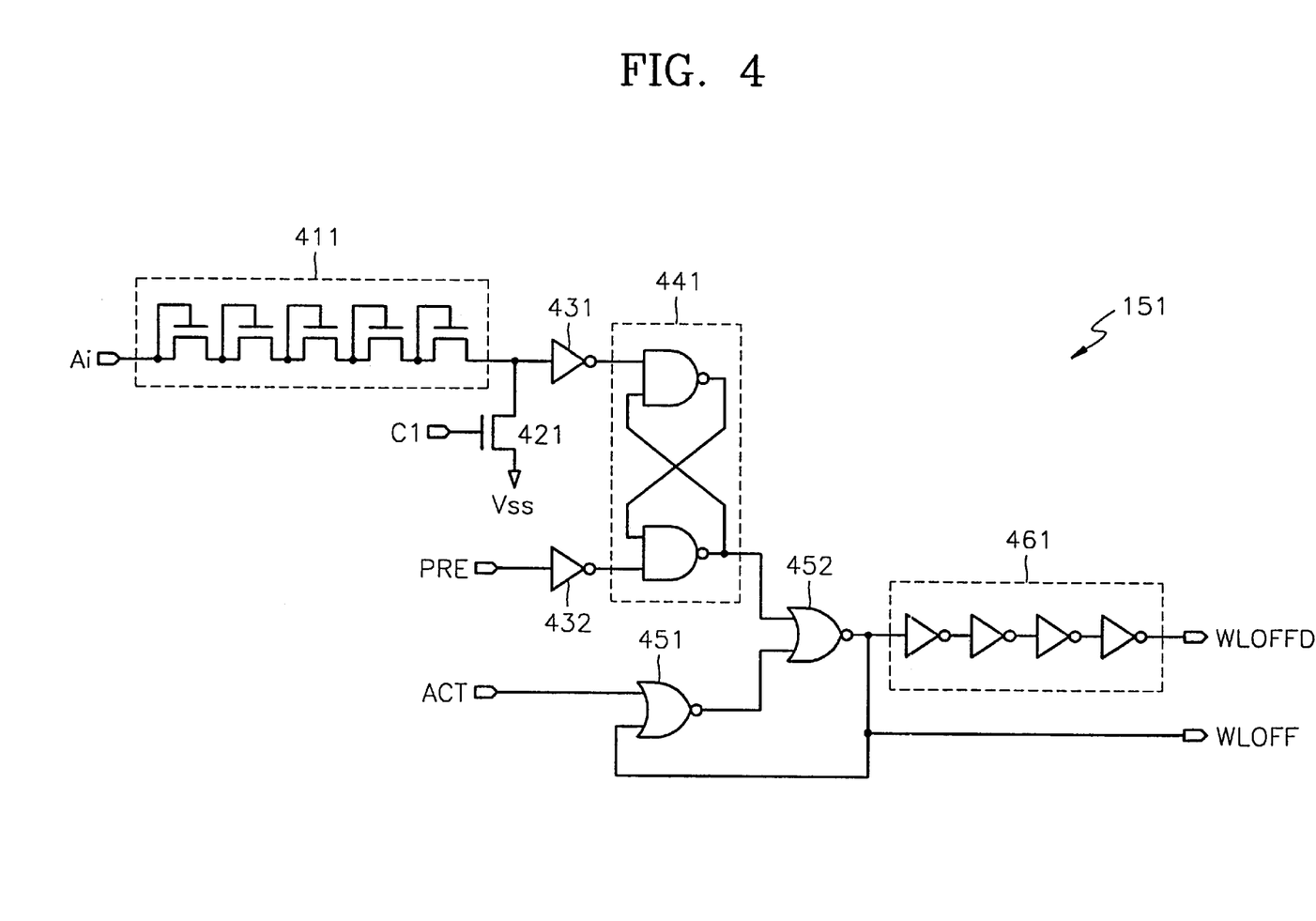
FIG. 4 is a circuit diagram of the first row decoding controller shown in FIG. 1 according to a second embodiment of the present invention.

Referring to FIG. 4, the first row decoding controller 151 according to a second embodiment of the present invention includes an NMOS transistor chain 411, an NMOS transistor 421, inverters 431 and 432, a flip-flop 441, NOR gates 451 and 452, and a delay unit 461.

The NMOS transistor chain 411 includes a plurality of serially connected NMOS transistors. A gate and a drain of each of the NMOS transistors are connected to each other, thus each NMOS transistor has the substantially same function as a diode. Therefore, when the row address Ai is received at a high voltage, the voltage level of the row address Ai is lowered by a predetermined level as the row address Ai passes through the NMOS transistor chain 411. When the number of NMOS transistors included in the NMOS transistor chain 411 is large, the degree by which the voltage of the row address Ai is lowered is large. When the number of NMOS transistors included in the NMOS transistor chain 411 is small, the degree by which the voltage of the row address Ai is lowered is small. The row address Ai whose voltage level is lowered by the NMOS transistor chain 411 is applied to the inverter 431. The row address Ai input to the NMOS transistor chain 411 is not an address signal for designating memory cells in the memory cell array (141 of FIG. 1) but a row address key signal for the use of generating the first word line control signal WLOFF.

The voltage level of the row address Ai applied to the NMOS transistor chain 411 is much higher than a supply voltage Vcc applied from the outside to the semiconductor memory device 101. For example, if the number of the NMOS transistors in the NMOS transistor chain 411 is five (5) as shown in FIG. 4, the voltage of the row address Ai may be Vcc+5 Vtn. 'Vtn' is a threshold voltage of the NMOS transistors in the NMOS transistor chain 411. Assuming that the NMOS transistors in the NMOS transistor chain 411 have an equal threshold voltage of 0.7 volts and the external supply voltage Vcc applied to the semiconductor memory device is 5 volts, the voltage of the row address Ai applied to the NMOS transistor chain 411 is equal to 8.5 volts. Thus, the NMOS transistor chain 411 prevents the first row decoding controller 151 from being activated by an external voltage lower than Vcc+5 Vtn.

The NMOS transistor 421 is controlled by a high voltage control signal C1. Namely, since the NMOS transistor 421 is turned on when the high voltage control signal C1 is logic high, an input voltage level of the inverter 431 is pulled down to the ground voltage Vss level. Since the NMOS transistor 421 is turned off when the high voltage control signal C1 is logic low, the output of the NMOS transistor chain 411 is input to the inverter 431. The inverter 432 inverts the precharge signal PRE. The flip-flop 441 receives outputs of the inverters 431 and 432, and continuously outputs a uniform voltage level according to the outputs of the inverters 431 and 432. That is, the flip-flop 441 continuously outputs a signal of logic high when the precharge signal PRE is logic high. The output of the flip-flop 441 is determined according to the output of the inverter 431 when the precharge signal PRE is logic low.

The NOR gate 451 performs a NOR operation on the active signal ACT and an output of the NOR gate 452, and outputs a result of the NOR operation. The NOR gate 452 performs a NOR operation on the output of the flip-flop 441 and the output of the NOR gate 451, and outputs a result of the NOR operation as the first word line control signal WLOFF. The delay unit 461 receives the first word line control signal WLOFF, delays the first word line control signal for a predetermined period of time, and outputs the second word line control signal WLOFFD. The delay unit 461 includes an even number of inverters. The predetermined delay time varies according to the number of the inverters. The NOR gates 451 and 452 and the flip-flop 441 can be configured using various logic circuits.

Figure 5:
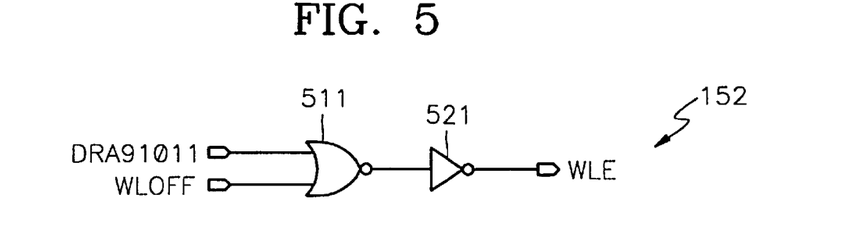
FIG. 5 is a circuit diagram of the second row decoding controller shown in FIG. 1.

The second row decoding controller 152 in FIG. 1 is connected to the predecoding unit 111, the first row decoding controller 151, and the row decoding and word line driving block 131. The second row decoding controller 152 receives the predecoding signal DRAij and the first word line control signal WLOFF and generates a word line enable signal WLE. FIG. 5 shows a preferred embodiment of the second row decoding controller 152 in FIG. 1.

Referring to FIG. 5, the second row decoding controller 152 includes a NOR gate 511 and an inverter 521. The NOR gate 511 receives a predecoding signal DRA9 1011 and the first word line control signal WLOFF, and performs a NOR operation on the predecoding signal DRA91011 and the first word line control signal WLOFF. The inverter 521 inverts an output of the NOR gate 511 and outputs the inverted output as the word line enable signal WLE. The predecoding signal DRA91011 is generated by predecoding upper row address bits of the row address Ai input to the predecoding unit 111. The upper row address bits are to select some of the memory blocks in the memory cell array 141.

Figure 6:
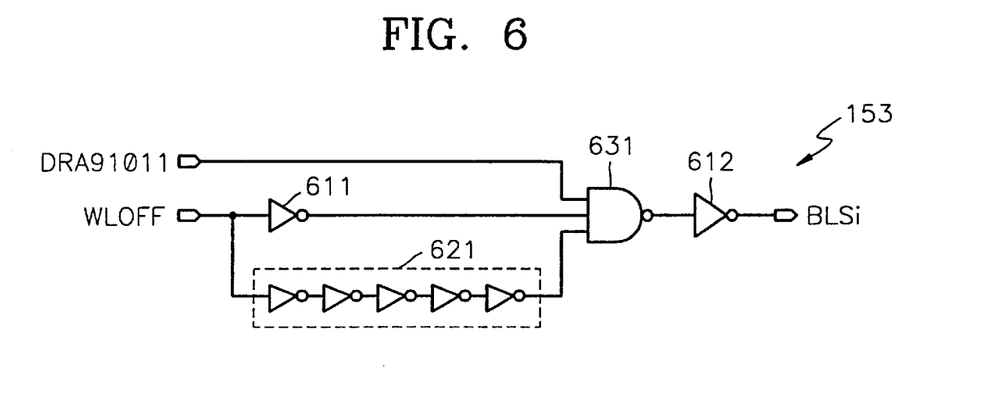
FIG. 6 is a circuit diagram of the third row decoding controller shown in FIG. 1.

The third row decoding controller 153 in FIG. 1 is connected to the predecoding unit 111, the first row decoding controller 151, and the row decoding and word line driving block 131, receives the predecoding signal DRAij and the first word line control signal WLOFF, and generates a block selection signal BLSi. FIG. 6 shows a preferred embodiment of the third row decoding controller 153 in FIG. 1.

Referring to FIG. 6, the third row decoding controller 153 includes inverters 611 and 612, an inverter chain 621, and a NAND gate 631. The inverter 611 inverts the first word line control signal WLOFF. The inverter chain 621 inverts the first word line control signal WLOFF and delays the first word line control signal WLOFF for a predetermined period of time. The inverter chain 621 has an odd number of inverters. The predetermined delay time varies according to the number of inverters. The NAND gate 631 receives the predecoding signal DRA91011, an output of the inverter 611, and an output of the inverter chain 621, and performs a NAND operation on the predecoding signal DRA91011, the output of the inverter 611, and the output of the inverter chain 621. The inverter 612 inverts an output of the NAND gate 631 and generates the block selection signal BLSi. The predecoding signal DRA91011 is the same as the predecoding signal DRA91011 input to the second row decoding controller 152.

Figure 7:
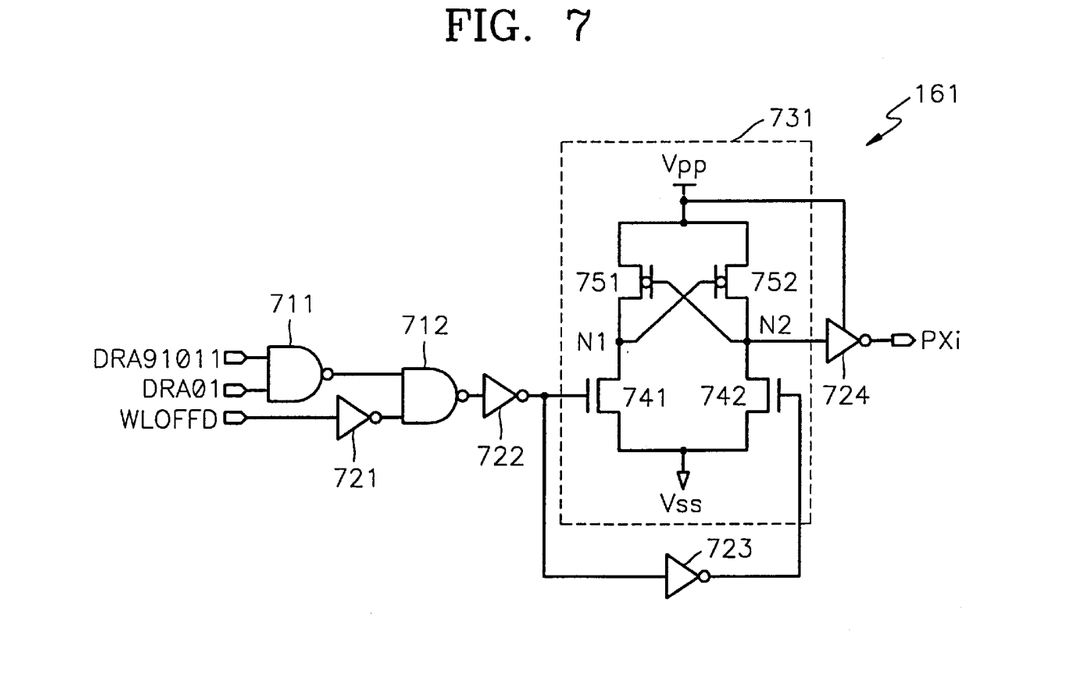
FIG. 7 is a circuit diagram of the word line driving controller shown in FIG. 1.

The word line driving controller 161 in FIG. 1 is connected to the predecoding unit 111, the first row decoding controller 151, and the row decoding and word line driving block 131, receives the predecoding signal DRAij and the second word line control signal WLOFFD, and generates a word line driving signal PXi. The word line driving signal PXi is for driving a word line WLi to a high voltage. The high level of the word line driving signal PXi is higher than the supply voltage Vcc of the semiconductor memory device 101. FIG. 7 shows a preferred embodiment of the word line driving controller 161 in FIG. 1.

Referring to FIG. 7, the word line driving controller 161 includes NAND gates 711 and 712, inverters 721 through 724, and a differential amplifier 731. The NAND gate 711 receives the predecoding signals DRA01 and DRA91011 and performs a NAND operation on the predecoding signals DRA01 and DRA91011. The inverter 721 inverts the second word line control signal WLOFFD. The NAND gate 712 performs a NAND operation on an output of the NAND gate 711 and an output of the inverter 721. The inverter 722 inverts an output of the NAND gate 712. The inverter 723 inverts an output of the inverter 722.

The differential amplifier 731 receives the outputs of the inverters 722 and 723 and amplifies a voltage difference between the inverters 722 and 723. Namely, since an NMOS transistor 741 is turned on when the output of the inverter 722 is logic high, a voltage level of a node N1 decreases to the ground voltage level. Then, since a PMOS transistor 752 is turned on, the differential amplifier 731 outputs a step-up voltage Vpp from a node N2. When the output of the inverter 722 is logic low, the output of the inverter 723 becomes logic high. Then, since the NMOS transistor 742 is turned on, the differential amplifier 731 outputs the ground voltage Vss from the node N2. Since a PMOS transistor 751 is turned on and the PMOS transistor 752 is turned off when the NMOS transistor 742 is turned on, the differential amplifier 731 continuously outputs a signal of logic low. The inverter 724 inverts the output of the differential amplifier 731 and generates the word line driving signal PXi. The supply voltage applied to the inverter 724 is the step-up voltage Vpp. Therefore, the inverter 724 outputs the word line driving signal PXi as the step-up voltage Vpp when the output of the differential amplifier 731 is logic low. When the second word line control signal WLOFFD is logic high or the predecoding signals DRA01 and DRA91011 are logic high, the word line driving signal PXi is output as the step-up voltage Vpp. When the second word line control signal WLOFFD is logic low and either the predecoding signal DRA01 or the predecoding signal DRA91011 is logic low, the word line driving signal PXi is output as the ground voltage Vss.

Figure 8:
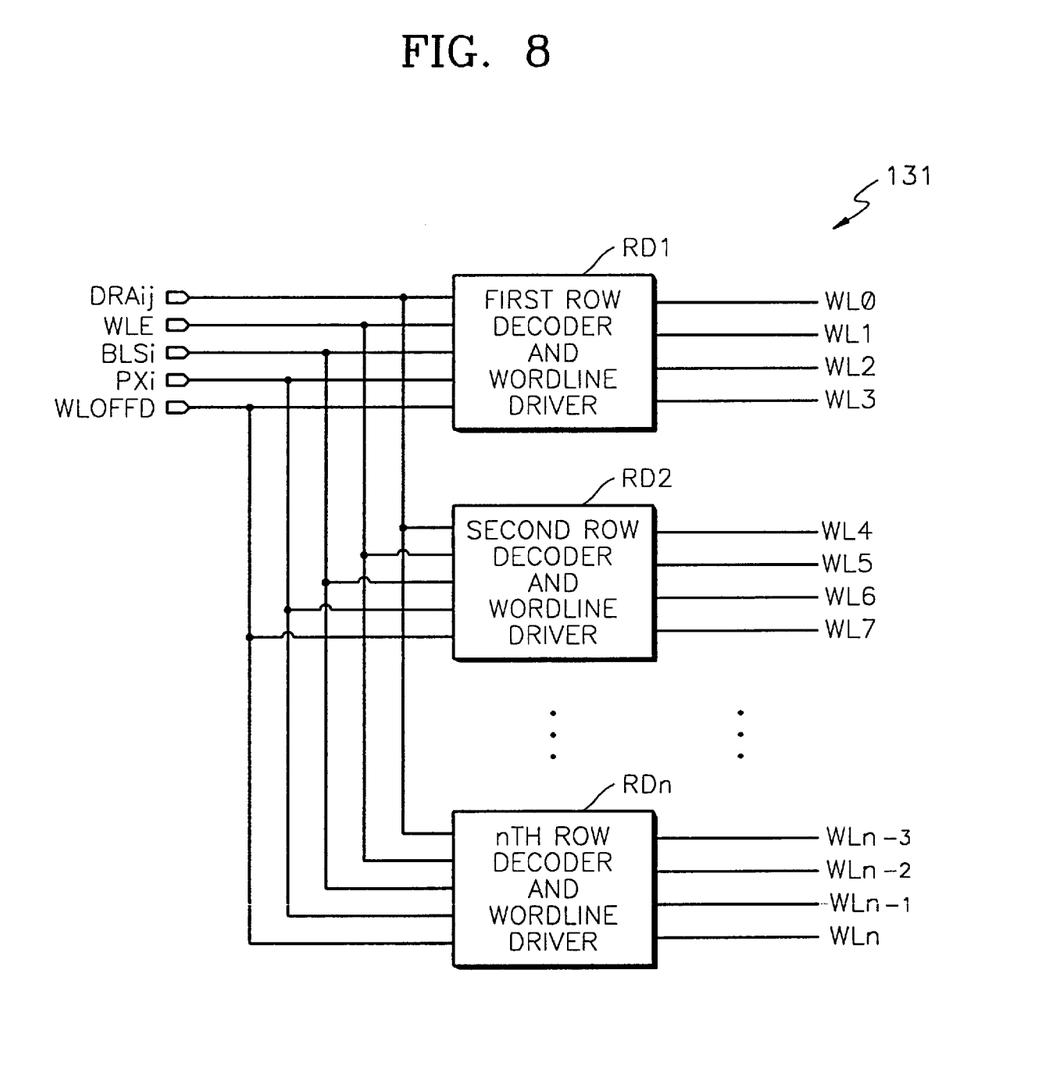
FIG. 8 is a block diagram of the row decoding and word line driving block shown in FIG. 1.

The row decoding and word line driving block 131 in FIG. 1 is connected to the predecoding unit 111, the first through third row decoding controllers 151 through 153, and the word line driving controller 161. The row decoding and word line driving block 131 receives the predecoding signal DRAij, the word line enable signal WLE, the block selection signal BLSi, the word line driving signal PXi, and the second word line control signal WLOFFD, and controls word lines WL0 through WLn in response to the received signals. FIG. 8 shows a preferred embodiment of the row decoding and word line driving block 131 in FIG. 1.

Figure 9:
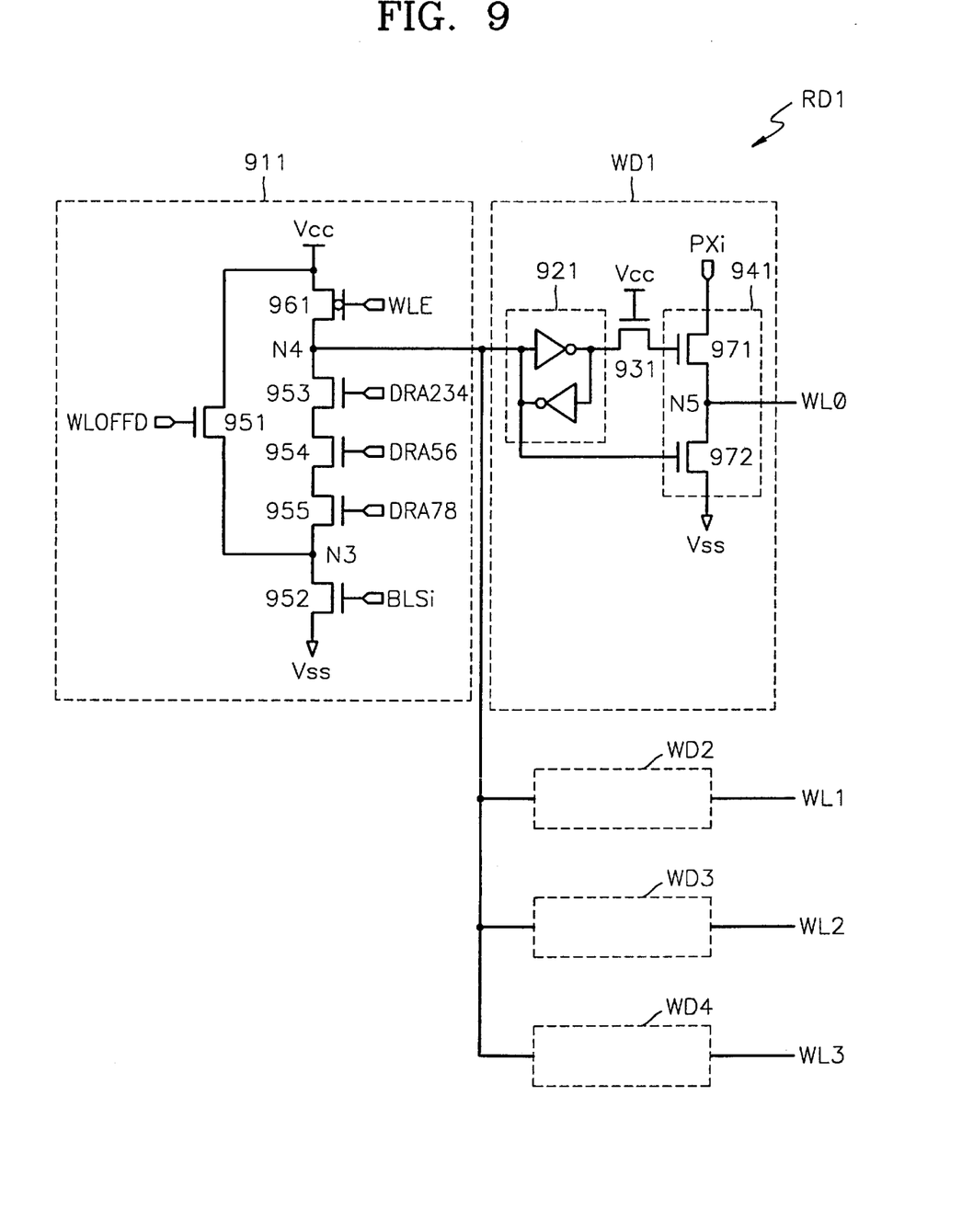
FIG. 9 is a circuit diagram of the first row decoder and word line driver shown in FIG. 8.

Referring to FIG. 8, the row decoding and word line driving block 131 includes first through nth row decoder and word line drivers RD1 through RDn. The first through nth row decoder and word line drivers RD1 through RDn each receives the predecoding signal DRAij, the word line enable signal WLE, the block selection signal BLSi, the word line driving signal Pxi, and the second word line control signal WLOFFD and controls four word lines. Since the first through nth row decoder and word line drivers RD1 through RDn have the same structure and operation, only the first row decoder and word line driver RD1 will be described. FIG. 9 shows a preferred embodiment of the first row decoder and word line driver RD1 in FIG. 8.

Referring to FIG. 9, the first row decoder and word line driver RD1 includes a row decoder 911 and first through fourth word line drivers WD1 through WD4. Since the first through fourth word line drivers WD1 through WD4 have the same structure and operation, only the first word line driver WD1 will be described. The first word line driver WD1 includes a latch 921, a pass transistor 931, and an output driver 941.

The row decoder 911 includes NMOS transistors 951 through 955 and a PMOS transistor 961. The NMOS transistor 951 is gated by the second word line control signal WLOFFD. Namely, since the NMOS transistor 951 is turned on when the second word line control signal WLOFFD is enabled to logic high, the voltage level of a node N3 increases to the supply voltage Vcc. The NMOS transistor 952 is gated by the block selection signal BLSi. Namely, since the NMOS transistor 952 is turned on when the block selection signal BLSi is enabled to logic high, the voltage level of a node N3 decreases to the ground voltage Vss level. The PMOS transistor 961 is gated by the word line enable signal WLE. Namely, since the PMOS transistor 961 is turned on when the word line enable signal WLE becomes logic low, the voltage of the node N4 increases to the level of the supply voltage Vcc. Since the PMOS transistor 961 is turned off when the word line enable signal WLE becomes logic high, the voltage level of the node N4 is determined by the NMOS transistors 951 through 955. The NMOS transistors 953 through 955 are gated by the predecoding signals DRA234, DRA56, and DRA78. Namely, since the NMOS transistors 953 through 955 are turned on when the predecoding signals DRA234, DRA56, and DRA78 are enabled to logic high, the voltage level of the node N4 approaches the voltage level of the node N3.

The row decoder 911 outputs the ground voltage Vss when the predecoding signals DRA234, DRA56, and DRA78 and the block selection signal BLSi are enabled. Conversely, the row decoder 911 outputs the supply voltage Vcc when one among the predecoding signals DRA234, DRA56, and DRA78 and the block selection signal BLSi is disabled and the word line enable signal WLE is enabled to logic low. When the word line enable signal WLE and the block selection signal BLSi are disabled and the second word line control signal WLOFFD and the predecoding signals DRA234, DRA56, and DRA78 are enabled, the voltage level of the node N3 increases to 'Vcc-Vtn'. The voltage level of the node N4 increases to the voltage level of the supply voltage Vcc by the latch 921. Here, Vtn is a threshold voltage of the NMOS transistors 953 through 955. It is assumed that the threshold voltages of the NMOS transistors 953 through 955 are equal.

Although in FIG. 9, the row decoder 911 receives the three (3) predecoding signals DRA234, DRA56, and DRA78, the number of the predecoding signals used for the row decoder 911 may vary. For example, only two (2) predecoding signals DRA56 and DRA78 may be used among the three (3) predecoding signals DRA234, DRA56, and DRA78, or four (4) predecoding signals DRA01, DRA234, DRA56, and DRA78 may be used. When the two (2) predecoding signals DRA56 and DRA78 are used, the number of simultaneously activated or disabled word lines increases. Accordingly, in this case, the number of the word lines connected to one row decoder and word line driver increases. When the four predecoding signals DRA01, DRA234, DRA56, and DRA78 are used, the number of simultaneously activated or disabled word lines is one. In this case, only one word line is connected to one row decoder and word line driver.

The output of the row decoder 911 is inverted and held by the latch 921. An output of the latch 921 is applied to the output driver 941 through the pass transistor 931. The output driver 941 includes NMOS transistors 971 and 972. The NMOS transistor 971 is gated by an output of the pass transistor 931. The word line driving signal PXi is applied to a drain of the NMOS transistor 971. The NMOS transistor 972 is gated by the output of the row decoder 911. A word line WL0 is connected to a node N5.

Since the NMOS transistor 971 is turned on when the output of the pass transistor 931 is logic high, the word line WL0 is activated to the step-up voltage Vpp by the word line driving signal Pxi. Since the NMOS transistor 971 is turned off and the NMOS transistor 972 is turned on when the output of the row decoder 911 is logic high, the voltage level of the word line WL0 decreases to the ground voltage Vss level. Namely, the word line WL0 is disabled.

The memory cell array 141 in FIG. 1 includes the plurality of word lines WL0 through WLn. A plurality of memory cells (not shown) are connected to the plurality of word lines WL0 through WLn.

Figure 10:
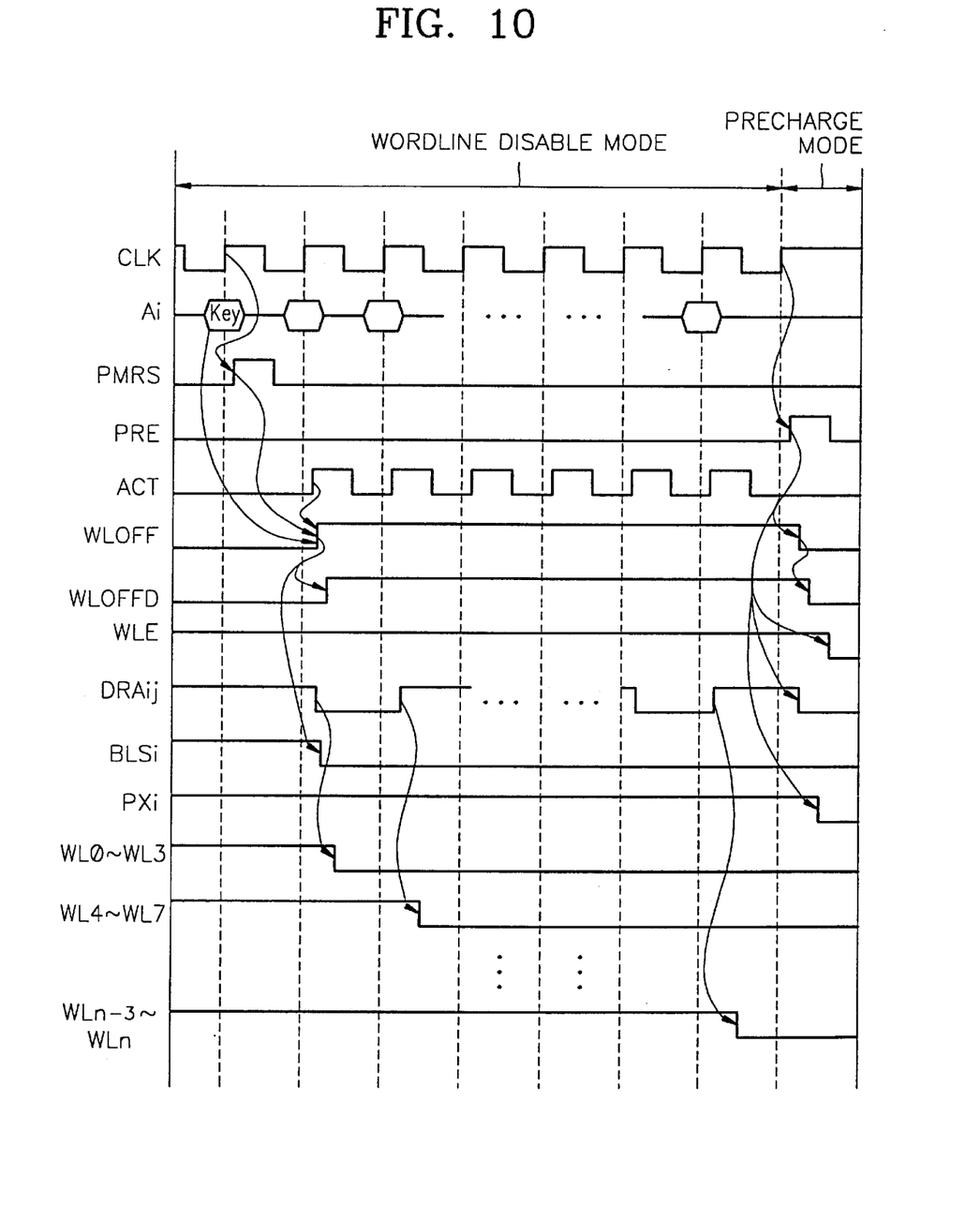
FIG. 10 is a timing diagram of signals shown in FIG. 1.

FIG. 10 is a timing diagram of the signals shown in FIG. 1. The operation of the semiconductor memory device 101 shown in FIGS. 1 through 9 will be described with reference to FIG. 10. The plurality of word lines WL0 through WLn are activated in a word line enable mode. In order to sequentially disable the activated word lines WL0 through WLn, the mode register set signal PMRS and the row address key signals Ai are enabled to logic high. Then, since the transmission gate (311 of FIG. 3) is turned on, the input of the latch (331 of FIG. 3) becomes logic high. At this time, since the precharge signal PRE is logic low, the NMOS transistor (321 of FIG. 3) is turned off. When the active signal ACT is enabled to logic high, the NOR gate (342 of FIG. 3) outputs a signal of logic high. Namely, the first row decoding controller 151 enables the first and second word line control signals WLOFF and WLOFFD to logic high. Accordingly, the block selection signal BLSi is disabled to logic low and the word line enable signal WLE is disabled to logic high. Since the second word line control signal WLOFFD and the word line enable signal WLE are logic high and the block selection signal BLSi is logic low, the NMOS transistor 951 of FIG. 9 is turned on and the NMOS transistor 952 and the PMOS transistor 961 are turned off. When the predecoding signals DRA234, DRA56, and DRA78 become logic high, the voltage level of the node N4 of FIG. 9 increases to the supply voltage Vcc level. When the voltage level of the node N4 is the supply voltage Vcc level, the NMOS transistor 971 is turned off and the NMOS transistor 972 is turned on. Thus, the word line WL0 is disabled.

Therefore, the word lines designated by the row address Ai are disabled in such a way that when the row address Ai is changed, the word lines designated by the changed row address are disabled. That is, when the row address Ai is changed to sequentially designate the word lines, the word lines designated by the row address Ai are also sequentially disabled. Therefore, the precharge noise is not generated in the semiconductor memory device 101 since the activated word lines are sequentially disabled.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A semiconductor memory device having a plurality of memory cells and a plurality of word lines connected to the plurality of memory cells, comprising:

a predecoding unit for predecoding a row address;

a row decoding and word line driving block, which is connected to the predecoding unit and the plurality of word lines, for decoding an output of the predecoding unit, and for selecting and activating a portion of the plurality of word lines; and a controller connected to the predecoding unit and the row decoding and word line driving block, for receiving the row address, the output of the predecoding unit, and at least one control signal, generating at least one output signal, and sequentially disabling activated word lines by enabling the at least one output signal in response to the row address and the output of the predecoding unit.

2. The semiconductor memory device of claim 1, wherein the at least one control signal is a mode register set signal for controlling operating modes of the semiconductor memory device.

3. The semiconductor memory device of claim 1, wherein the at least one control signal has a voltage higher than a supply voltage of the semiconductor memory device.

4. The semiconductor memory device of claim 1, wherein the controller receives a precharge signal for controlling a precharge mode of the semiconductor memory device and disables the at least one output signal when the precharge signal is enabled, thus operating the semiconductor memory device in a precharge mode.

5. The semiconductor memory device of claim 1, wherein the controller comprises:

a first row decoding controller for generating first and second word line control signals by receiving the row address, the mode register set signal, the precharge signal, and an active signal, wherein the first row decoding controller enables the first and second word line control signals when the mode register set signal and the active signal are enabled in a state where the precharge signal is disabled, and disables the first and second word line control signals when the precharge signal is enabled;

a second row decoding controller connected to the first row decoding controller, the predecoding unit, and the row decoding and word line driving block, for providing the row decoding word line driving block with a word line enabled signal in response to the first word line control signal and the output of the predecoding unit;

a third row decoding controller connected to the first row decoding controller, the predecoding unit, and the row decoding and word line driving block, for providing the row decoding and word line driving block with a block selection signal in response to the first word line control signal and the output of the predecoding unit; and a word line driving controller for receiving the second word line control signal and the output of the predecoding unit, and for providing the row decoding and word line driving block with a word line driving signal in response to the first word line control signal and the output of the predecoding unit.

6. The semiconductor memory device of claim 5, wherein the second word line control signal is delayed for a predetermined time with respect to the first word line control signal.

7. The semiconductor memory device of claim 5, wherein the first row decoding controller includes:
- a transmission gate for transmitting the row address in response to the mode register set signal;
- a logic circuit for performing a predetermined logic operation with respect to an output of the transmission gate and the active signal to generate the first word line control signal;
- a transistor connected between the transmission gate and the logic circuit and gated by the precharge signal, for transferring an output of the transmission gate to the logic circuit in response to the precharge signal; and
- a delay circuit for delaying the first word line control signal for a predetermined time to generate the second word line control signal.

8. The semiconductor memory device of claim 5, wherein the first row decoding controller receives a high voltage higher than a supply voltage applied to the semiconductor memory device, the precharge signal, and the active signal, and generates the first and second word line control signals, wherein the first row decoding controller enables the first and second word line control signals when the high voltage is applied and the active signal is enabled in a state where the precharge signal is disabled, and disables the first and second word line control signals when the precharge signal is enabled.

9. The semiconductor memory device of claim 8, wherein the first row decoding controller further receives a high voltage control signal, wherein the first row decoding controller receives the high voltage in response to the high voltage control signal.

10. The semiconductor memory device of claim 5, wherein the first row decoding controller includes:
- a transistor chain having a plurality of transistors, for lowering a high voltage input by a level depending on the number of the plurality of transistors;
- a first logic circuit for performing a predetermined first logic operation with respect to an output of the transistor chain and the precharge signal;
- a transistor gated by a high voltage control signal, for controlling transmission of the output of the transistor chain to the first logic circuit in response to the high voltage control signal;
- a second logic circuit for performing a predetermined second logic operation with respect to an output of the first logic circuit and the active signal to generate the first word line control signal; and
- a delay circuit for delaying the first word line control signal for a predetermined time to generate the second word line control signal.

11. The semiconductor memory device of claim 10, wherein the delay circuit includes an even number of inverters, the predetermined time of delay depending on the number of inverter.

12. The semiconductor memory device of claim 5, wherein the second row decoding controller enables the word line enable signal when the output of the predecoding unit is enabled, the output of the predecoding unit being generated by predecoding upper bits of the row address.

13. The semiconductor memory device of claim 5, wherein the third row decoding controller enables the block selection signal when the output of the predecoding unit is enabled, the output of the predecoding unit being generated by predecoding upper bits of row address.

14. The semiconductor memory device of claim 13, wherein the third row decoding controller includes:

- an inverter chain having a plurality of inverters, for inverting and delaying the first word line control signal; and
- a logic circuit for operating a predetermined logic operation on the first word line control signal, the output of the inverter chain, and the output of the predecoding unit to generate the block selection signal.

15. The semiconductor memory device of claim 5, wherein the output of the predecoding unit input to the word line driving controller is upper bits of the row address for selecting some of the plurality of memory cells.

16. The semiconductor memory device of claim 5, wherein the word line driving controller includes:
- a logic circuit for performing a predetermined logic operation with respect to the second word line control signal and the output of the predecoding unit;
- an inverter for inverting an output of the logic circuit; and
- a differential amplifier receiving a supply voltage, for amplifying a voltage difference between the output of the logic circuit and an output of the inverter to generate the word line driving signal.

17. The semiconductor memory device of claim 16, wherein the word line driving signal is a step-up voltage when one of the second word line control signal and the output of the predecoding unit is enabled, the step-up voltage being substantially equal to the supply voltage.

18. The semiconductor memory device of claim 5, wherein the row decoding and word line driving block includes a plurality of row decoder and word line drivers, each row decoder and word line driver receiving the output of the predecoding unit, the word line enable signal, the block selection signal, the word line driving signal, and the second word line control signal, for selecting a portion of the plurality of word lines to activate or disable the selected word lines.

19. The semiconductor memory device of claim 18, wherein the row decoder and word line driver includes:
- a row decoder for receiving the output of the predecoding unit, the word line enable signal, the block selection signal, and the second word line control signal, for outputting a ground voltage when the output of the predecoding unit and the block selection are enabled, and for outputting a supply voltage when the word line enable signal is enabled and one of the output of the predecoding unit and the block selection signal is disabled; and
- a plurality of word line drivers, each word line driver connected to a word line for activating or disabling the word line in response to the word line driving signal and an output of the row decoder.

20. The semiconductor memory device of claim 19, wherein the word line driver includes:
- a latch circuit for latching the output of the row decoder; and
- an output driver having a plurality of transistors connected in serial between a terminal receiving the word line driving signal and a ground terminal, each transistor being gated by one of the output of the row decoder and an output of the latch circuit, the output driver activating or disabling the word line in response to the output of the row driver.

* * * * *